United States Patent
Liu et al.

(10) Patent No.: US 12,382,746 B2
(45) Date of Patent: Aug. 5, 2025

(54) SOLAR CELL, PHOTOVOLTAIC DEVICE, AND PHOTOVOLTAIC SYSTEM

(71) Applicant: TRINA SOLAR CO., LTD., Changzhou (CN)

(72) Inventors: Chengfa Liu, Changzhou (CN); Shuai Zhang, Changzhou (CN); Hong Chen, Changzhou (CN); Yugang Lu, Changzhou (CN); Wanli Li, Changzhou (CN); Yang Zou, Changzhou (CN)

(73) Assignee: TRINA SOLAR CO., LTD., Changzhou (CN)

( * ) Notice: Subject to any disclaimer, the term of this patent is extended or adjusted under 35 U.S.C. 154(b) by 0 days.

(21) Appl. No.: 18/383,090

(22) Filed: Oct. 24, 2023

(65) Prior Publication Data
US 2024/0429340 A1 Dec. 26, 2024

(30) Foreign Application Priority Data
Jun. 25, 2023 (CN) .......................... 202321618728.1

(51) Int. Cl.
*H10F 71/00* (2025.01)
*H10F 77/20* (2025.01)
*H10F 77/30* (2025.01)

(52) U.S. Cl.
CPC ......... *H10F 71/129* (2025.01); *H10F 77/215* (2025.01); *H10F 77/311* (2025.01)

(58) Field of Classification Search
None
See application file for complete search history.

(56) References Cited

U.S. PATENT DOCUMENTS

| | | | |
|---|---|---|---|
| 4,828,628 A | * | 5/1989 | Hezel ...................... H10F 10/14 257/773 |
| 10,991,834 B1 | | 4/2021 | Li et al. |

(Continued)

FOREIGN PATENT DOCUMENTS

| | | |
|---|---|---|
| CN | 203573989 U | 4/2014 |
| CN | 103531658 B | 11/2015 |

(Continued)

OTHER PUBLICATIONS

Tao et al. Prog. Photovolt. Res. Appl. 2016, 24, 830-835. (Year: 2016).*

(Continued)

*Primary Examiner* — Eli S Mekhlin
(74) *Attorney, Agent, or Firm* — Taft Stettinius & Hollister LLP (57) ABSTRACT

The present application relates a solar cell, a photovoltaic device and a photovoltaic system. The solar cell includes a substrate, a first passivation layer, and a second passivation layer. The substrate includes a first surface and a second surface opposite to each other along a thickness direction of the substrate. The first passivation layer is disposed on the first surface of the substrate. The second passivation layer is disposed on a side of the first passivation layer away from the substrate. A material of the first passivation layer is the same as that of the second passivation layer. An atomic packing density of the first passivation layer is higher than that of the second passivation layer. An average thickness of the first passivation layer is smaller than that of the second passivation layer.

15 Claims, 4 Drawing Sheets

(56) References Cited

U.S. PATENT DOCUMENTS

| | | | |
|---|---|---|---|
| 2007/0238311 A1 | 10/2007 | Levy | |
| 2008/0231931 A1 | 9/2008 | Londergan et al. | |
| 2009/0165855 A1 | 7/2009 | Sun et al. | |
| 2011/0114992 A1 | 5/2011 | Schmid et al. | |
| 2011/0146770 A1 | 6/2011 | Dieter et al. | |
| 2011/0180802 A1 | 7/2011 | Morosawa et al. | |
| 2011/0265866 A1 | 11/2011 | Oh et al. | |
| 2011/0297227 A1 | 12/2011 | Pysch et al. | |
| 2012/0192943 A1* | 8/2012 | Vermang | H10F 77/311 257/E31.113 |
| 2012/0255612 A1 | 10/2012 | Pierreux | |
| 2013/0109132 A1 | 5/2013 | Stewart et al. | |
| 2013/0149808 A1 | 6/2013 | Park et al. | |
| 2013/0247972 A1 | 9/2013 | Mungekar et al. | |
| 2015/0001657 A1* | 1/2015 | Miyazaki | H10F 77/311 257/431 |
| 2015/0047698 A1* | 2/2015 | Hollars | H01L 31/03923 438/94 |
| 2015/0075605 A1 | 3/2015 | Miyamoto et al. | |
| 2015/0136221 A1 | 5/2015 | Miyazaki et al. | |
| 2019/0326454 A1 | 10/2019 | Greer et al. | |
| 2020/0105516 A1 | 4/2020 | Fuchs et al. | |

FOREIGN PATENT DOCUMENTS

| | | | |
|---|---|---|---|
| CN | 111540791 A | 8/2020 | |
| CN | 111668317 A | 9/2020 | |
| CN | 112117188 A | 12/2020 | |
| CN | 113097342 A | 7/2021 | |
| CN | 113437184 A | 9/2021 | |
| CN | 113690328 A | 11/2021 | |
| CN | 114420790 A | 4/2022 | |
| CN | 115101605 A | 9/2022 | |
| CN | 115132851 A | 9/2022 | |
| CN | 115188833 A | 10/2022 | |
| CN | 115706173 A | 2/2023 | |
| CN | 218548445 U | 2/2023 | |
| JP | 2011249813 A | 12/2011 | |
| JP | 2015056529 A | 3/2015 | |
| JP | 2015191907 A | 11/2015 | |
| JP | 2016103642 A | 6/2016 | |
| JP | 2022108026 A | 7/2022 | |
| WO | 2012133692 A1 | 4/2012 | |
| WO | 2013002285 A1 | 1/2013 | |
| WO | 2013115275 A1 | 8/2013 | |
| WO | WO-2013123225 A1 * | 8/2013 | ....... H01L 31/02167 |
| WO | 2017002747 A1 | 1/2017 | |
| WO | 2017047311 A1 | 3/2017 | |

OTHER PUBLICATIONS

Australian Patent Office, Examination Report No. 3 issued in corresponding Application No. 2023219826, dated May 23, 2024, 8 pp.
Examination Report No. 1 for corresponding Application No. 2023219826 dated Sep. 28, 2023, 9 pages.
Australian Patent Office, Examination Report No. 1 issued in corresponding Application No. 2023254962, dated Aug. 28, 2024, 3 pp.
Japanese Patent Office, Office Action issued in corresponding Application No. 2023-144248, dated September 2 3, 2024, 3 pp.
Australian Examination Report No. 2 for corresponding AU Application No. 2023219826, dated Feb. 6, 2024, 6 pages.
Chinese Office Action for corresponding CN Application No. 202310388825.4, dated Mar. 6, 2024, 7 pages.
European Search Report for corresponding EP Application No. 23194286.3, dated Jan. 29, 2024, 7 pages.
European Search Report for corresponding EP Application No. 23207160.5, dated Jan. 30, 2024, 7 pages.
Japanese Patent Office, Office Action issued in corresponding Application No. 2023-144248, dated Jan. 14, 2025, 4 pp.
U.S. Patent and Trademark Office, Final Office Action issued in U.S. Appl. No. 18/369,946, dated Feb. 10, 2025, 17 pp.

* cited by examiner

SOLAR CELL, PHOTOVOLTAIC DEVICE, AND PHOTOVOLTAIC SYSTEM

CROSS-REFERENCE TO RELATED APPLICATIONS

This application claims priority to Chinese patent application No. 2023216187281, filed on Jun. 25, 2023, and titled "SOLAR CELL, PHOTOVOLTAIC DEVICE, AND PHOTOVOLTAIC SYSTEM", the content of which is hereby incorporated herein in its entirety by reference. This application is related to commonly-assigned application Ser. No. 18/369,946, filed on September 29, and entitled, "FILM PREPARATION METHOD, SOLAR CELL, PHOTOVOLTAIC DEVICE, AND PHOTOVOLTAIC SYSTEM", the content of which is hereby incorporated herein in its entirety by reference.

TECHNICAL FIELD

The present application relates to the field of photovoltaic power generation technology, and in particular to solar cells, photovoltaic devices, and photovoltaic systems.

BACKGROUND

With the continuous development of semiconductor technology, the requirements for the performance of semiconductor devices are constantly increasing. Passivation is a technique that can significantly enhance the performance of the devices.

For example, the formation of a passivation layer can significantly increase the photoelectric conversion efficiency of the solar cells. However, the urgent problem to be solved is how to improve the passivation effect of the passivation layer.

SUMMARY

In view of the above technical issues, there is a need to provide a solar cell, a photovoltaic device, and a photovoltaic system to improve the passivation effect of the passivation layer, so as to improve the photoelectric conversion efficiency of the solar cell.

In a first aspect, the present application provides a solar cell, including:
 a substrate, including a first surface and a second surface opposite to each other in a thickness direction of the substrate;
 a first passivation layer, disposed on the first surface of the substrate;
 a second passivation layer, disposed on a side of the first passivation layer away from the substrate;
 wherein a material of the first passivation layer is the same as that of the second passivation layer; an atomic packing density of the first passivation layer is higher than that of the second passivation layer; an average thickness of the first passivation layer is smaller than that of the second passivation layer.

Optionally, the average thickness of the first passivation layer is in a range from 0.1 nm to 6 nm, and the average thickness of the second passivation layer is in a range from 1 nm to 30 nm.

Optionally, a thickness uniformity of the first passivation layer is greater than that of the second passivation layer.

Optionally, a thickness difference between different regions of the first passivation layer is smaller than 0.5 nm, and a thickness difference between different regions of the second passivation layer is greater than 0.5 nm.

Optionally, the first passivation layer and the second passivation layer further cover a peripheral side of the substrate. A covering area of the first passivation layer on the peripheral side of the substrate is less than or equal to a covering area of the second passivation layer on the peripheral side of the substrate.

Optionally, the substrate includes a first thickness section and a second thickness section arranged in sequence in a direction away from the first passivation layer; the first passivation layer covers the peripheral side corresponding to the first thickness section, and the second passivation layer covers the peripheral side corresponding to the first thickness section and the second thickness section.

Optionally, a thickness (T1) of the first thickness section is greater than or equal to ½ of a thickness (T) of the substrate, and smaller than or equal to the thickness of the substrate. A sum of the thickness of the first thickness section and a thickness (T2) of the second thickness section is greater than or equal to ⅔ of the thickness of the substrate, and smaller than or equal to the thickness of the substrate. In other words, T1 and T2 satisfy ½*T≤T1≤T and ⅔*T≤T1+T2≤T.

Optionally, the thickness of the first thickness section is in a range from 10 μm to 200 μm, and the sum of the thicknesses of the first thickness section and the second thickness section is in a range from 50 μm to 200 μm.

In a second aspect, the present application provides a photovoltaic device, including a plurality of solar cells connected in series and/or in parallel; at least one of the solar cells is the solar cell as described in the first aspect.

In a third aspect, the present application provides a photovoltaic system, including the photovoltaic device as described in the second aspect.

DETAILED DESCRIPTION

To make the objectives, features, and advantages of the present application clearer and understandable, embodiments of the present application will be described in detail below with reference to the accompanying drawings. In the following description, many specific details are described in order to facilitate a comprehensive understanding of the present application. However, the present application can be implemented in many other ways different from those described herein, and a person skilled in the art can make similar modifications without departing from the present application, and therefore, the present application is not limited to the specific embodiments disclosed below.

Unless the context otherwise requires, throughout the specification and claims, the terms "include" and other synonyms thereof are interpreted as an open inclusive meaning, i.e., "include, but is not limited to". In the present specification, the terms such as "an embodiment", "some embodiments", "an exemplary embodiment", "exemplarily", "an example", and "some examples" are intended to describe that the specified features, such as structures, materials, and properties, can be included in at least one embodiment or example of the present application, but not necessarily in the same embodiment or example. The specified features may be included in any one or more embodiments or examples in any appropriate way.

The exemplary embodiments are described with reference to sectional views and/or plan views, as idealized exemplary drawings. In the drawings, a layer or a region may be enlarged in thickness for clarity. Therefore, variations in shape relative to the drawings due to, for example, manufacturing techniques and/or tolerances can be envisaged. Consequently, the exemplary embodiments should not be interpreted as being limited to the shapes shown in the drawings, but may include shape deviations due to, for example, manufacturing. For example, an etched region shown in a rectangular shape may include a curved feature. Accordingly, the regions shown in the drawings are schematic in nature, and their shapes are not intended to show actual shapes of the regions in a device, and are not intended to limit the scope of the exemplary embodiments.

The term "and/or" used to join elements A and B includes the following three combinations: A only, B only, and a combination of A and B.

In the present application, the terms or phrases "for example", "such as", "exemplary", "for instance", etc., are used for descriptive purposes, indicating that the technical solutions before and after are related in terms of content, but the latter should not be understood as a limitation on the former technical solution, nor can be understood as a limitation on the scope of protection of the present application. Unless otherwise stated, A (such as B) means that B is a non-limiting example of A, and A is not limited to B.

The terms "optional", "optionally", and "may" indicate that the specified features are not mandatory and can be present or absent, indicating a choice between "having" or "not having". If there are more than one "optional" in a technical solution, without otherwise specified and without contradictions or mutual constraints, each "optional" choice is considered independently.

The descriptions such as "optionally contain" and "optionally include" means "include or not include". An "optional component X" means presence or absence of the component X, or to include or not include the component X.

The terms "first" and "second", such as "in a first aspect", "in a second aspect", etc. are used for descriptive purposes only, and cannot be construed as indicating or implying relative importance or quantity, or implicitly specifying the importance or quantity of the indicated technical features.

It should be noted that, when an element is referred to as "being fixed to" or "being disposed on" another element, the element may be directly located on the other element, or there may be an intermediate element therebetween. When an element is referred to as "being connected to" another element, the element may be directly connected to the other element, or there may be an intermediate element therebetween. The terms "vertical", "horizontal", "upper", "lower", "left", "right" and similar expressions used herein are for illustrative purposes only and are not meant to be the only implementation.

Unless otherwise defined, all technical and scientific terms used herein have the same meaning as commonly understood by one of ordinary skill in the art to which the present application applies. The terms used in the specification of the present application herein are for the purpose of describing specific embodiments only and are not intended to limit the present application.

In open-ended descriptions of technical features, a closed technical solution consisting the listed features is included, as well as an open-ended technical solution including the listed features.

When a numerical interval (i.e., a numerical range) is mentioned, unless otherwise specified, the distribution of suitable values in the numerical interval is considered as being continuous, and includes two numerical endpoints (i.e., the minimum and maximum values) as well as every value between the two numerical endpoints. Unless otherwise specified, when the numerical interval refers to only integers in the numerical interval, the two end integers of the numerical interval and every integer between the two end integers are included, which is equivalent to directly enumerating each integer. When multiple numerical ranges are provided to describe a specific feature or characteristic, these numerical ranges can be combined. In other words, unless otherwise indicated, the numerical ranges in the present application should be understood to encompass any and all subranges included therein. The "values" in the numerical interval can be any quantitative values, such as numbers, ratios, etc. The term "numerical interval" broadly encompasses types of numerical intervals, such as proportional intervals, ratio intervals, etc.

A solar cell is a semiconductor device that converts light into electrical energy through the photoelectric effect. The solar cell technology has gone through the conversion from the conventional aluminum back surface field (BSF) cells to the passivated emitter and rear cells (PERCs), and then to the passivated emitter and rear cells with selective emitter (PERC+SE). Compared with conventional BSF cells, PERC+SE technology adds a laser SE secondary diffusion process and a back passivation process after the conventional diffusion process. The back passivation layer formed by the back passivation process is the main improved structure of PERC solar cells compared with the conventional cells. Due to the passivation layer covered on the back surface of the substrate, the back surface of the substrate is passivated, thereby improving a long-wave response, and reducing the surface recombination rate, thereby improving the photoelectric conversion efficiency of the solar cells.

In addition to the cells listed above, other known cells with high photoelectric conversion performance also include a passivation layer to reduce an interfacial state density between a substrate and a metal contact area, blocking the migration of minority carriers to the metal contact area, thereby reducing the probability of electron-hole recombination and improving the passivation effect.

The solar cell with the high photoelectric conversion performance can be, for example, an N-type tunnel oxide passivated contact (TOPCon) cell or a P-type interdigitated back contact (IBC) cell.

The N-type TOPCon cell refers to a TOPCon solar cell with an N-type silicon substrate, and the P-type IBC cell refers to an IBC solar cell with a P-type silicon substrate.

Take the N-type TOPCon cell as an example, the two opposite surfaces of the substrate can be configured to receive incident light. The substrate can be doped with N-type ions. The N-type ions can be any one of phosphorus (P), arsenic (As), or antimony (Sb). A tunnel layer and a doped polysilicon film are disposed on the back surface of the substrate. The tunnel layer together with the doped polysilicon film can form a passivation contact layer. The tunnel layer is configured to realize the interface passivation to the back surface of the substrate and configured to reduce the interfacial state density between the substrate and the doped polysilicon film. As such, the concentration of majority carriers are much higher than that of the minority carriers, reducing the probability of electron-hole recombination, while increasing the electrical resistivity, so as to form a selective contact of the majority carriers.

The material of the tunnel layer can be a dielectric material, such as at least one of silicon dioxide, magnesium fluoride, amorphous silicon, polysilicon, silicon carbide, silicon nitride, silicon oxynitride, aluminum oxide, or titanium dioxide. The tunnel layer can be combined with the dangling bonds on the back surface of the substrate, thereby inhibiting the carrier recombination on the surface of the solar cell, so as to improve the photoelectric conversion efficiency of the solar cell.

The tunnel layer has a similar function as the above-mentioned passivation layer, and thus the tunnel layer can include the above-mentioned passivation layer.

In some embodiments, the N-type TOPCon cell further includes a back passivation layer disposed on a side of the doped polysilicon film away from the tunnel layer. The back passivation layer can reduce the concentration of the minority carriers at the back side of the substrate, thereby reducing the surface recombination rate and improving the photoelectric conversion efficiency.

In some embodiments, the material of the back passivation layer can include one or more of silicon dioxide, aluminum oxide, silicon nitride, silicon oxynitride, or silicon oxycarbonitride.

The back passivation layer has a similar function as the passivation layer, and thus the back passivation layer can include the above-mentioned passivation layer.

In some embodiments, the N-type TOPCON cell includes an emitter disposed on the front side of the substrate. The emitter can be a P-type doped layer, obtained by doping the substrate with P-type ions. The emitter and the substrate form a PN junction. The N-type TOPCON cell can further include a front passivation layer disposed on a side of the emitter away from the substrate. The material of the front passivation layer can include one or more of silicon dioxide, aluminum oxide, silicon nitride, silicon oxynitride, or silicon oxycarbonitride. Similar to the above-mentioned back passivation layer, the front passivation layer can reduce the concentration of the minority carriers at the front side of the substrate, thereby reducing the surface recombination rate and improving the photoelectric conversion efficiency.

The front passivation layer also has a similar function as the above-mentioned passivation layer, and thus the front passivation layer can include the above-mentioned passivation layer.

While the above-mentioned passivation layer can effectively improve the photoelectric conversion efficiency of the solar cells, the passivation effect of the passivation layer is related to the material and the forming process of the passivation layer. How to improve the passivation effect and the forming efficiency of the passivation layer by controlling the forming process is a pressing issue to be addressed.

Figure 1:
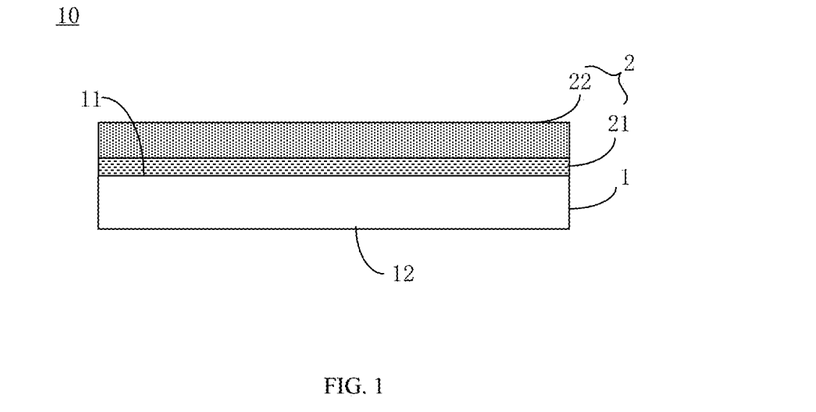
FIG. 1 is a schematic structural view of a solar cell provided by an embodiment of the present application.

In view of the above, in a first aspect, some embodiments of the present application provide a solar cell 10. Referring to FIG. 1, the solar cell 10 includes a substrate 1 and a passivation layer 2 disposed on the substrate 1. The substrate 1 includes a first surface 11 and a second surface 12 located opposite to each other in the thickness direction of the substrate 1. The passivation layer 2 includes a first passivation layer 21 and a second passivation layer 22. The first passivation layer 21 is disposed on the first surface 11 of substrate 1. The second passivation layer 22 is disposed on a side of the first passivation layer 21 away from substrate 1.

The first surface 11 and the second surface 12 can be the front surface and the back surface of the substrate 1, respectively. When the first surface 11 is the front surface of the substrate 1, the first passivation layer 21 and the second passivation layer 22 are disposed on the front of the substrate 1. When the first surface 11 is the back surface of the substrate, the first passivation layer 21 and the second passivation layer 22 are disposed on the back of substrate 1.

The above is only an example. The passivation layer 2 can be disposed on both the front and the back of the substrate 1. In other words, the front passivation layer and the back passivation layer each can include the first passivation layer 21 and the second passivation layer 22.

In the following description, the passivation layer 2 disposed on the front side of the substrate 1 is taken as an example; that is, the first surface 11 is the front surface of the substrate 1.

In some embodiments, the substrate 1 can be a silicon wafer. The material of the silicon wafer can include at least one of monocrystalline silicon, polycrystalline silicon, amorphous silicon, or microcrystalline silicon.

In some embodiments, the first passivation layer 21 and the second passivation layer 22 include the same material. For example, both the first passivation layer 21 and the second passivation layer 22 are made of aluminum oxide. Aluminum oxide not only can prevent unnecessary early recombination of electrons and holes, but also can act as a mirror to reflect light, redirecting the light to the active area of the solar cell and converting light energy into electricity, thereby further improving the photoelectric conversion efficiency of the solar cell.

In some embodiments, the first passivation layer 21 and the second passivation layer 22 can further include other materials included in the above-mentioned front passivation layer, such as, one or more of silicon dioxide, aluminum oxide, silicon nitride, silicon oxynitride, or silicon oxycarbonitride.

In some embodiments, the atomic packing density of the first passivation layer 21 is higher than that of the second passivation layer 22, and the average thickness of the first passivation layer 21 is smaller than that of the second passivation layer 22.

It can be understood by those skilled in the art, in order to realize passivation, the first passivation layer 21 and the second passivation layer 22 can be both continuous films, rather than discontinuous structures. However, for the films formed by various forming processes disclosed by related art, the thicknesses at different positions may be inconsistent. Thus, in order to describe the thickness difference between the first passivation layer 21 and the second passivation layer 22, the average thickness is used herein to represent the overall thickness of a film. The average thickness can be understood as the average of the thicknesses at different positions of the same film.

Atomic packing density, also known as atomic packing factor or spatial maximum utilization, refers to the fraction of volume occupied by atoms themselves in a unit cell, i.e., the ratio of the volume of atoms contained in the unit cell to the volume of the unit cell.

The atomic packing density of the first passivation layer 21 is higher than that of the second passivation layer 22, which means that the atomic packing factor of the material of the first passivation layer 21 is greater than that of the material of the second passivation layer 22.

For example, the atomic packing factor of the material of the first passivation layer 21 is greater than that of the material of the second passivation layer 22.

For example, on the condition that the material contained in the first passivation layer 21 and the material contained in the second passivation layer 22 are respectively aluminium oxides, the atomic packing density of the aluminium oxide in the first passivation layer 21 is greater than that of the aluminium oxide in the second passivation layer 22.

The atomic packing density of a film can be controlled by the forming process of the film. For example, the first passivation layer 21 can be formed by using atomic layer deposition (ALD). The second passivation layer 22 can be formed by using plasma-enhanced chemical vapor deposition (PECVD). Alternatively, both of the first passivation layer 21 and the second passivation layer 22 can be formed by using ALD or PECVD, while the deposition rate of the first passivation layer 21 is lower than that of the second passivation layer 22.

ALD is a layer-by-layer deposition technique that can deposit a substance in a monatomic layer at a time on the surface of the substrate. During the film deposition process, two or more chemical vapor precursors react on the substrate surface one at a time to form a solid film.

PECVD is a film deposition technique that uses a discharge phenomenon to ionize atoms of the target material, and then conducts chemical reaction deposition on the substrate 1.

It can be understood that due to the reaction mechanism that ALD can form only one layer of atoms at a time, the atomic layer deposition using ALD is relatively slow, resulting in relatively low productivity of ALD but relatively good coverage of the substrate surface. In contrast, PECVD does not need to deposit the precursor one at a time, which can greatly improve the forming efficiency. However, the uniformity of the film formed by using PECVD is relatively poor, leading to relatively thick coverage on a smooth surface and relatively thin coverage on a coarse surface. In addition, the film formed by using PECVD has a relatively low atomic packing density, and the ionization process may cause a bombardment damage to the passivated surface.

Therefore, in an embodiment of the present application, the first passivation layer 21 and the second passivation layer 22 can be respectively formed by using ALD and PECVD. Alternatively, the first passivation layer 21 and the second passivation layer 22 can be formed by using the same method, while the forming speed of the first passivation layer 21 is controlled to be lower than that of the second passivation layer 22, thereby forming the first passivation layer 21 with a higher atomic packing density and the second passivation layer 22 with a lower atomic packing density. As such, on the one hand, the suitable forming method, such as ALD, can be selected and the forming speed can be adjusted for forming the first passivation layer 21. Since ALD is based on a self-terminating surface-limited reaction between volatile precursor molecules and the substrate, using ALD can achieve nano-sized precise control of film thickness, and can easily obtain the crack-free, dense, and conformal high-quality first passivation layer 21, thereby ensuring the film forming quality of the first passivation layer 21. On the other hand, by controlling the thickness of the first passivation layer 21 to be smaller than the thickness of the second passivation layer 22, and by using a faster method, such as PECVD, for forming the second passivation layer 22, the forming efficiency of the passivation layer 2 can be maximized while maintaining a certain thickness of the passivation layer 2. As such, the passivation effect and the forming efficiency of the passivation layer 2 can be effectively improved, so as to effectively balance the relationship between the passivation effect and the forming efficiency and improve the passivation effect.

In addition, the second passivation layer 22 can protect the first passivation layer 21, thereby effectively reducing the problems such as insufficient strength and easy damage caused by the thin first passivation layer 21, so that the passivation layer 2 can have sufficient reliability.

In addition, by having the first passivation layer 21 and the second passivation layer 22 made of the same material, when forming other films or layers in the solar cell, only the properties of the same material of the first passivation layer 21 and the second passivation layer 22 need to be considered, and there is no need to consider the effects of the locations of the other films or layers.

In some embodiments, take the first passivation layer 21 and the second passivation layer 22 each including an aluminium oxide as an example, the aluminium oxide is represented by $AlO_x$, where x is in a range from 1.45 to 1.55 in the first passivation layer 21, and is in a range from 0.5 to 2 in the second passivation layer 22. In addition, the values of x are different in different regions of the second passivation layer 22.

In these embodiments, the first passivation layer 21 has relatively good material uniformity, while the second passivation layer 22 has relatively poor material uniformity. This further reveals that the uniformity of the material can be adjusted by controlling the forming process and the forming speed. Consequently, the first passivation layer 21 can exhibit a good passivation effect, whereas the passivation effect of the second passivation layer 22 is relatively poor. However, the forming efficiency of the passivation layer 2 can be effectively improved.

In some embodiments, the proportion of trivalent aluminum ions of the aluminium oxide in the first passivation layer 21 is relatively high, exceeding 85% by mole.

In some embodiments, the average thickness of the first passivation layer 21 is in a range from 0.1 nm to 6 nm, and the average thickness of the second passivation layer 22 in a range from 1 nm to 30 nm.

In these embodiments, by controlling the average thickness of the first passivation layer 21 and the second passivation layer 22 within the above ranges, the passivation effect can be maximized and the forming efficiency can be taken into account. Thus, the photoelectric conversion efficiency can be maximized.

It should be noted that the average thickness of the first passivation layer 21 being in a range from 0.1 nm to 6 nm means that the average thickness of the first passivation layer 21 can be any value selected from 0.1 nm to 6 nm. For example, the average thickness of the first passivation layer 21 can be 0.1 nm, 0.2 nm, 0.3 nm, 0.4 nm, 0.5 nm, 0.6 nm, 0.7 nm, 0.8 nm, 0.9 nm, 1 nm, 2 nm, 3 nm, 4 nm, 5 nm, or 6 nm.

The average thickness of the second passivation layer 22 being in a range from 1 nm to 30 nm means that the average thickness of the second passivation layer 22 can be any value selected from 1 nm to 30 nm. For example, the average thickness of the second passivation layer 22 can be 1 nm, 2 nm, 3 nm, 4 nm, 5 nm, 6 nm, 7 nm, 8 nm, 9 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, or 30 nm.

It should also be noted that since the average thickness of the first passivation layer 21 is smaller than that of the second passivation layer 22, when the average thickness of the second passivation layer 22 is 1 nm as an example, the average thickness of the first passivation layer 21 can be any value greater than or equal to 0.1 nm and smaller than 1 nm, and when the average thickness of the first passivation layer 21 is 6 nm as an example, the average thickness of the second passivation layer 22 can be any value greater than 6 nm and smaller than or equal to 30 nm.

In some embodiments, the first passivation layer 21 and the second passivation layer 22 have appropriate thicknesses, so as to improve the photoelectric conversion efficiency of the solar cell. Take the first passivation layer 21 and the second passivation layer 22 with a total thickness of 25 nm as an example, the thickness of the first passivation layer 21 can be any value in a range from 0.1 nm to 6 nm, the thickness of the second passivation layer 22 can be any value in a range from 19 nm to 24.9 nm, while the sum of the thicknesses of the first passivation layer 21 and the second passivation layer 22 is 25 nm.

In some embodiments, the thickness uniformity of the first passivation layer 21 is greater than that of the second passivation layer 22.

In these embodiments, as the thickness uniformity of the first passivation layer 21 is greater than that of the second passivation layer 22, the surface of the first passivation layer 21 is relatively smooth, exhibiting better coverage on the surface of the substrate 1. In contrast, the surface of the second passivation layer 22 is relatively coarse, resulting in poorer coverage on the surface of the substrate 1. Thus, the first passivation layer 21 exhibits a more effective passivation effect as compared to the second passivation layer 22.

In some embodiments, the thickness difference between different regions of the first passivation layer 21 is smaller than 0.5 nm, and the thickness difference between different regions of the second passivation layer 22 is greater than 0.5 nm.

In these embodiments, the uniformity of the first passivation layer 21 is greater than that of the second passivation layer 22. In addition, though the average thickness of the first passivation layer 21 is smaller than that of the second passivation layer 22, a local thickness of the first passivation layer 21 may be still greater than that of the second passivation layer 22 at specific locations, as the thickness uniformity of the first passivation layer 21 is greater than that of the second passivation layer 22.

Figure 2:
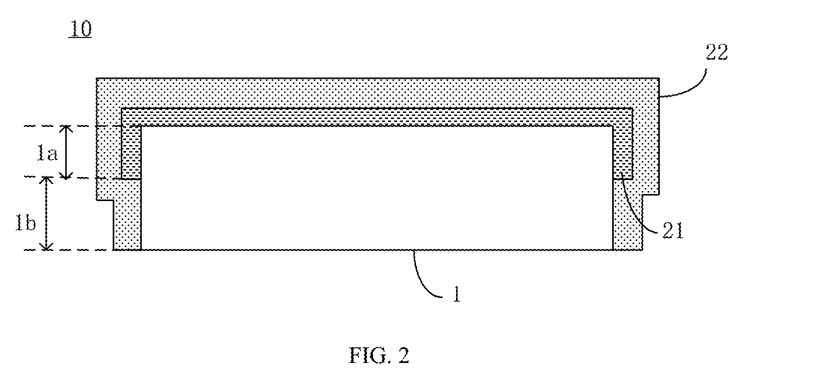
FIG. 2 is a schematic structural view of a solar cell provided by another embodiment of the present application.

In some embodiments, referring to FIG. 2, the first passivation layer 21 and the second passivation layer 22 further cover a peripheral side of the substrate 1. The covering area of the first passivation layer 21 on the peripheral side of the substrate 1 is less than or equal to the covering area of the second passivation layer 22 on the peripheral side of the substrate 1.

In these embodiments, by controlling the covering area of the first passivation layer 21 on the peripheral side of the substrate 1 to be less than or equal to the covering area of the second passivation layer 22 on the peripheral side of the substrate 1, and the wraparound of the first passivation layer 21 can be reduced. As such, the subsequent wraparound of the passivation layer 2 on the second surface of the substrate 1 can be avoided, so that the subsequent wraparound on the second surface can be easily removed, reducing the occurrence of poor contact between the metal electrodes and the substrate 1.

In some embodiments, the substrate 1 includes a first thickness section 1a and a second thickness section 1b arranged sequentially in a direction away from the first passivation layer 21.

The first passivation layer 21 covers the peripheral side corresponding to the first thickness section 1a, and the second passivation layer 22 covers the peripheral side corresponding to the first thickness section 1a and the second thickness section 1b. In some embodiments, the first passivation layer 21 only covers the peripheral side corresponding to the first thickness section 1a, not covering the peripheral side corresponding to the second thickness section 1b.

In these embodiments, by forming the first passivation layer 21 and the second passivation layer 22 on the peripheral side of the substrate 1, the carrier recombination rate at the peripheral side of the solar cell can be further reduced, thereby further enhancing the photoelectric conversion efficiency of the solar cell.

In some embodiments, the thickness of the first thickness section 1a is greater than or equal to ½ of the thickness of the substrate 1, and smaller than or equal to the thickness of the substrate 1. The sum of the thicknesses of the first thickness section 1a and the second thickness section 1b is greater than or equal to ⅔ of the thickness of substrate 1, and smaller than or equal to the thickness of substrate 1. In other words, $½*T \leq T1 \leq T$ and $⅔*T \leq T1+T2 \leq T$, where T1 represents the thickness of the first thickness section 1a, T2 represents the thickness of the second thickness section 1b, and T represents the thickness of the substrate 1.

In these embodiments, the first passivation layer 21 covers a smaller area of the peripheral side of the substrate 1 and thus produces a smaller wraparound than the second passivation layer 22.

In some embodiments, by controlling the wraparound of the first passivation layer 21, only the second passivation layer 22 may partially or entirely cover the peripheral side of the substrate 1.

In some embodiments, the second passivation layer 22 further wraparounds the second surface 12 of the substrate 1.

In some embodiments, the thickness of the substrate 1 is in a range from 80 μm to 200 μm, and, as a result, the thickness of the first thickness section 1a can be in a range from 10 μm to 200 μm, and the sum of the thicknesses of the first thickness section 1a and the second thickness section 1b can be in a range from 50 μm to 200 μm.

In these embodiments, the covering area of the second passivation layer 22 is greater than or equal to that of the first passivation layer 21. Therefore, the area of the peripheral side covered by the second passivation layer 22 (corresponding to the sum of the thicknesses of the first thickness section 1a and the second thickness section 1b) is greater than or equal to the area of the peripheral side covered by the first passivation layer 21 (corresponding to the thickness of the first thickness section 1a). When the thickness of the first thickness section 1a corresponding to the peripheral side covered by the first passivation layer 21 is equal to 200 μm, the thickness of the sum of the thicknesses of the first thickness section 1a and the second thickness section 1b corresponding to the peripheral side covered by the second passivation layer 22 can also be equal to 200 μm, and the second passivation layer 22 can wraparound the second surface of the substrate 1.

The covering area of the first passivation layer 21 on the peripheral side of the substrate 1 can be controlled by controlling the forming process, so as to reduce the wraparound of the first passivation layer 21.

The first passivation layer 21 and the second passivation layer 22 can be formed by using different methods. For example, the first passivation layer 21 can be formed by using the ALD method, and the second passivation layer 22 can be formed by using the PECVD method. Alternatively, the first passivation layer 21 and the second passivation layer 22 can be formed by using the same method. For example, both of the first passivation layer 21 and the second passivation layer 22 can be formed by using the ALD method. In this case, the forming speed of the first passivation layer 21 is controlled to be lower than that of the second passivation layer 22.

In order to control the coverage area of the first passivation layer 21 and/or the second passivation layer 22 on the peripheral side of the substrate 1 and to reduce the wraparound, the passivation layer 2 can be formed by using an ALD time method or an ALD space method.

Take the formation of the first passivation layer 21 by using the ALD time method or the ALD space method as an example, the ALD reaction chamber can be provided with multiple jet heads. The different jet heads are configured to introduce different gaseous substances into the reaction chamber. The reaction chamber correspondingly includes a plurality of jet regions. The jet heads are disposed in the plurality of jet regions respectively in a one-to-one manner.

For example, the gaseous substances that can be introduced include but are not limited to various precursor sources (such as a first precursor source and a second precursor source), inert gases, etc.

In some embodiments, the jet heads can be mounted to the upper wall of the reaction chamber, and the substrate 1 can be placed on the bottom wall of the reaction chamber, and the gaseous substances are ejected along a direction perpendicular to the first surface of the substrate 1, so as to ensure that the first precursor source and the second precursor source can be evenly adsorbed on the first surface of the substrate 1 for the reaction. Take the material of the first passivation layer 21 being aluminum oxide as an example, the first precursor source can be an aluminum source, such as trimethyl-aluminum (TMA). The second precursor source can be an oxygen source, such as water, ozone, or a combination thereof.

Figure 3:
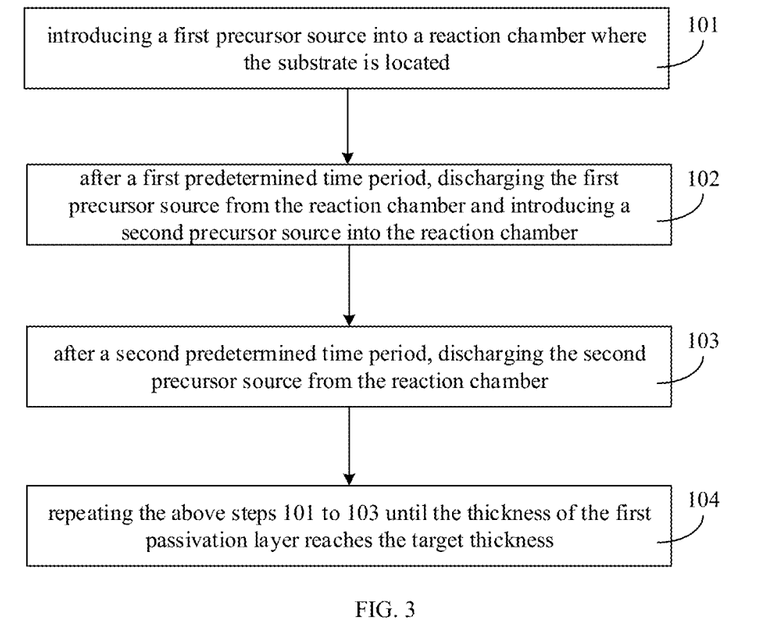
FIG. 3 is a flow chart of a process of forming a first passivation layer by using an ALD time method provided by an embodiment of the present application.

Referring to FIG. 3, the ALD time method can include following steps:
  step 101, introducing a first precursor source into a reaction chamber where the substrate 1 is located;
  step 102, after a first predetermined time period, discharging the first precursor source from the reaction chamber and introducing a second precursor source into the reaction chamber;
  step 103, after a second predetermined time period, discharging the second precursor source from the reaction chamber; and
  step 104, repeating the above steps 101 to 103 until the thickness of the first passivation layer 21 reaches the target thickness.

In step 101, after the first precursor source is introduced into the reaction chamber, the first precursor source is adsorbed onto the substrate 1 under the protection of the inert gas, and forms an aluminum film on the substrate 1. The first precursor source is discharged from the reaction chamber after a first predetermined time period. The first predetermined time period refers to a period of time from the moment when the jet head begins to eject the first precursor source to the moment when the aluminum film just entirely covers the first surface of the substrate 1. The second precursor source is introduced at this time, which can effectively prevent the reaction between the residual first precursor source and the subsequently introduced second precursor source, so that the unwanted reaction product can be effectively inhibited from attaching to the second surface of the substrate 1, as the unwanted reaction product may affect the subsequent reaction on the first surface of the substrate 1 or result in uneven film formation on the first surface of the substrate 1. The first predetermined time period can be related to at least one of the area of the first surface of the substrate 1, the volume of the reaction chamber, the flow rate and/or jet pressure of the second precursor source introduced from the jet head, the distance between the jet head and the substrate 1, etc., to control the deposition time of the aluminum film.

In step 102 and step 103, after the second precursor source is introduced into the reaction chamber, the second precursor source will react with the aluminum film formed on the first surface of the substrate 1 and generate the corresponding product until the first precursor source in the reaction chamber is completely consumed, thereby forming the first passivation layer 21. The second predetermined time period refers to a period of time from the moment when the jet head begins to eject the second precursor source to the moment when the oxygen atoms of the second precursor source just entirely covers the first surface of the substrate 1. Since the unreacted first precursor source has been completely discharged before the introducing of the second precursor source, the atomic layer deposition can be prevented from occurrence in areas of the substrate 1 other than the first surface after the introducing of the second precursor source. In this way, the separation in term of time between the first precursor source and the second precursor source is realized, so that a larger proportion of the first precursor source and the second precursor source can react on the first surface of the substrate 1 to reduce the wraparound.

The second predetermined time period can be related to at least one of the area of the first surface of the substrate 1, the volume of the reaction chamber, the flow rate and/or jet pressure of the second precursor source introduced from the jet head, the distance between the jet head and the substrate 1, etc., to control the deposition time of oxygen atoms.

Figure 4:
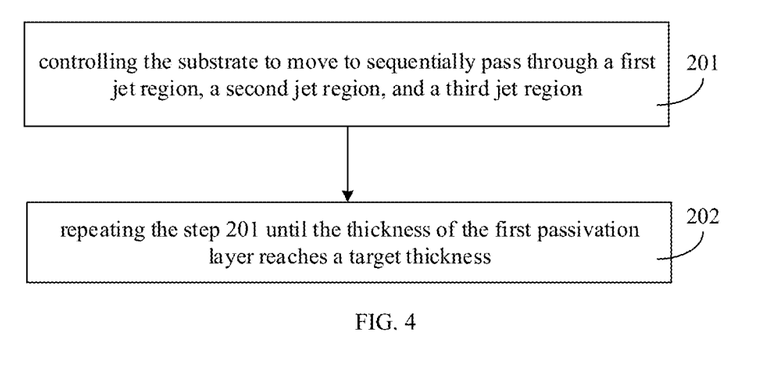
FIG. 4 is a flow chart of a process of forming a first passivation layer by using an ALD space method provided by an embodiment of the present application.

In some embodiments, referring to FIG. 4, the ALD space method can include following steps:
  step 201, controlling the substrate 1 to move to sequentially pass through a first jet region, a second jet region, and a third jet region, wherein the first precursor source is introduced to the first jet region, a spacing gas is introduced to the second jet region, and the second precursor source is introduced to the third jet region; and step 202, repeating the step 201 until the thickness of the first passivation layer 21 reaches a target thickness.

Figure 5:
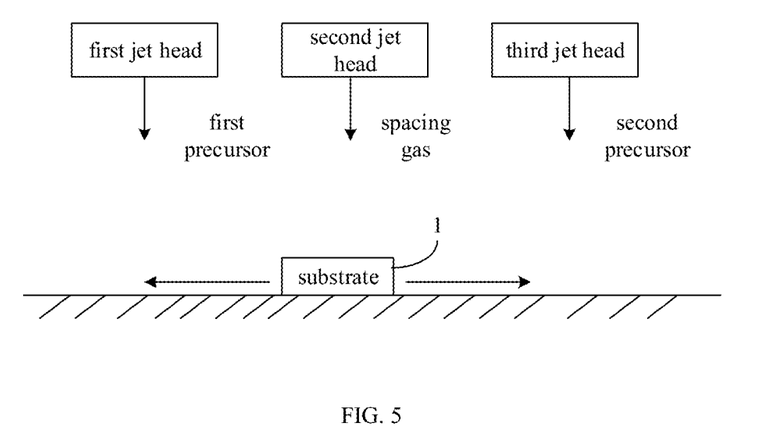
FIG. 5 is a schematic view of an arrangement of jet heads on the basis of FIG. 4, provided by an embodiment of the present application.

Referring to FIG. 5, the substrate 1 is placed on a heating plate, and the heating plate is moved to drive the substrate 1 to move in the reaction chamber. The first precursor source, the spacing gas, and the second precursor source are respectively introduced through different jet heads, i.e., a first jet head configured to eject the first precursor source, a third jet head configured to eject the second precursor source, and a second jet head configured to eject the spacing gas.

The spacing gas is a gas that does not react with either the first precursor source or the second precursor source. Referring to FIG. 5, the first jet head, the second jet head, and the third jet head are arranged in sequence along the movement direction of the substrate 1, being linearly arranged on the upper wall of the reaction chamber. The substrate 1 is disposed on the heating plate, and is driven to pass through each jet region in sequence by controlling the movement of the heating plate, so that the first jet head, the second jet head, and the third jet head can eject the corresponding gaseous substances toward the first surface of the substrate 1. By using the spacing gas to separate the first precursor source from the second precursor source, the reaction between the first precursor source and the second precursor source before their arrival at the substrate, as well as at areas other than the first surface of the substrate 1, can be suppressed, thereby reducing the wraparound.

In some embodiments, the spacing gas can be nitrogen gas ($N_2$) or an inert gas.

In some embodiments, the moving speed of the substrate 1 can be determined according to flow rates and/or jet pressures of the gaseous substances introduced from the jet heads, so as to ensure the deposition performance of the first passivation layer 21.

It can be understood that the performance of the atomic layer deposition is related to the adsorption of the first precursor source, the reaction with the second precursor source, and the separation by the spacing gas. Therefore, the moving speed of the substrate 1, the flow rate and/or the jet pressure of the gaseous substances introduced from the jet heads, and the control logic of the jet heads can be appropriately adjusted according to the requirements for the atomic layer deposition.

In some embodiments, the jet heads can constantly introduce the corresponding gaseous substances into the reaction chamber to simplify the control logic of the jet heads and optimize the adsorption effect of the first precursor source, the reaction effect with the second precursor source, and the separation effect by the spacing gas.

In another embodiment, the jet heads may introduce the corresponding gaseous substances into the reaction chamber only from the moment that the substrate 1 enters the corresponding jet regions, so as to save the materials.

In another embodiment, the jet heads corresponding to the precursor sources can be controlled to introduce the corresponding precursor sources into the reaction chamber only from the moment that the substrate 1 enters the corresponding jet regions, and the jet head corresponding to the spacing gas can be controlled to constantly introduce the spacing gas into the reaction chamber, so as to save the precursor sources while ensuring the spacing effect and the reaction effect.

The above embodiments involve arranging only one set of jet heads in the reaction chamber. In some other embodiments, multiple sets of jet heads can be arranged sequentially in the reaction chamber. Each set of jet heads includes a first jet head, a second jet head, and a third jet head being arranged in sequence along the movement direction of the substrate 1.

Figure 6:
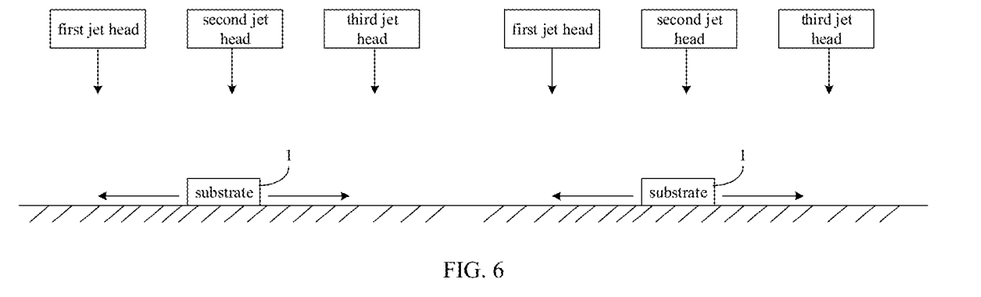
FIG. 6 is a schematic view of an arrangement of jet heads on the basis of FIG. 4, provided by another embodiment of the present application.

In an embodiment, referring to FIG. 6, two sets of jet heads are arranged in the reaction chamber. Each set of jet heads includes the first jet head, the second jet head, and the third jet head being arranged in sequence along the movement direction of the substrate 1. The substrate is controlled to move linearly so as to pass through the jet regions in sequence, thereby realizing multiple and continuous atomic layer depositions, thus further improving the forming efficiency of the first passivation layer 21.

Referring to FIG. 5, it should be noted that in the embodiment where only one set of jet heads is arranged in the reaction chamber, after one cycle of reaction, the gaseous substances in the reaction chamber is completely evacuated, and the substrate 1 is moved back to the first jet region again to repeat the former steps. This embodiment has lower requirement on the size of the reaction chamber, and thus is more suitable for small scale production. In contrast, in the embodiment shown in FIG. 6, where multiple sets of jet heads are arranged, the reaction chamber is relatively large, which is more suitable for a mass production scenario.

Compared with the ALD time method for forming the first passivation layer 21, in the ALD space method for forming the first passivation layer 21, a separation in terms of space is realized by controlling the substrate 1 to move in sequence through the first jet region, the second jet region, and the third jet region, with no need of exhausting the reaction chamber, thereby greatly reducing the time required for forming the first passivation layer 21.

In this method, by using the second jet region to separate the first precursor source from the second precursor source in terms of space, and reasonably setting the width of the second jet region and the flow rate and/or jet pressure of the spacing gas, the first precursor source and the second precursor source can be effectively separated from each other, so that a large proportion of the first precursor source and the second precursor source can react on the first surface of the substrate 1, thereby reducing the wraparound.

Figure 7:
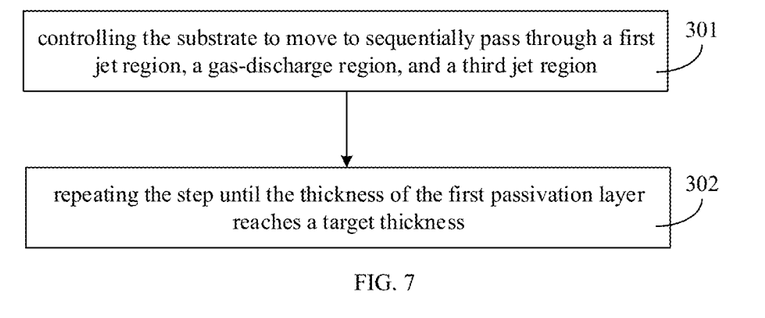
FIG. 7 is a flow chart of a process of forming a first passivation layer by using an ALD space method provided by another embodiment of the present application.

In some other embodiments, referring to FIG. 7, the ALD space method can include following steps:

step 301, controlling the substrate 1 to move to sequentially pass through a first jet region, a gas-discharge region, and a third jet region, wherein the first precursor source is introduced to the first jet region, and the second precursor source is introduced to the third jet region;

step 302, repeating the step 301 until the thickness of the first passivation layer 21 reaches a target thickness.

Figure 8:
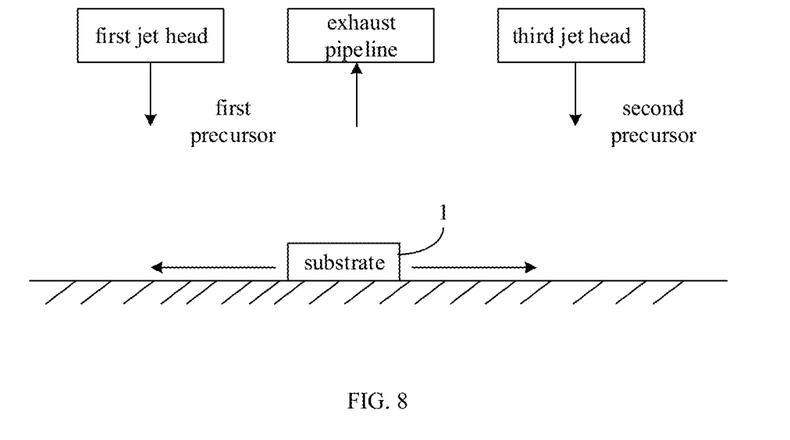
FIG. 8 is a schematic view of an arrangement of jet heads on the basis of FIG. 7, provided by another embodiment of the present application.

Referring to FIG. 8, the substrate 1 is placed on a heating plate, and the heating plate is moved to drive the substrate 1 to move in the reaction chamber. The first precursor source and the second precursor source are respectively introduced from different jet heads, that is, a first jet head configured to eject the first precursor source and a third jet head configured to eject the second precursor source. The gas-discharge region is disposed between the first jet head and the second jet head, and is configured to discharge gaseous substances in the gas-discharge region from the reaction chamber.

Specifically, by having the gas-discharge region, the first precursor source or the second precursor source diffused to the gas-discharge region can be timely discharged from the reaction chamber, so that the reaction between the first precursor source and the second precursor source is suppressed, and the wraparound can be reduced. Similarly to the above-mentioned embodiment using the spacing gas to space the first precursor source from the second precursor source, through the gas-discharge region, the excess first precursor source and second precursor source can be timely discharged from the reaction chamber, which can also reduce the reaction between the first precursor source and the second precursor source before their arrival at the substrate, as well as at areas other than the first surface of the substrate 1, so as to reduce the wraparound.

In some embodiments, referring to FIG. 8, an exhaust pipeline can be disposed in the gas-discharge region. The exhaust pipeline is connected to a vacuum pump, which can realize the suction of gaseous substances from the gas-discharge region, thereby timely discharging the excess first precursor source or the excess second precursor source diffused to the gas-discharge region from the reaction chamber.

In these embodiments, the separation in terms of space can also be realized by using the gas-discharge region with no need of exhausting the entire reaction chamber, thereby greatly reducing the time required for forming the first passivation layer. In addition, by using the gas-discharge region to separate the first precursor source from the second precursor source, and reasonably setting the width of the gas-discharge region, the first precursor source and the second precursor source can be effectively separated from each other, so that a large proportion of the first precursor source and the second precursor source can react on the first surface of the substrate 1, thereby reducing the wraparound.

In some embodiments, two sets of jet heads are arranged in the reaction chamber in a sequence along the movement direction of the substrate 1. One set of jet heads includes a first jet head, a second jet head, and a third jet head, wherein the second jet head is disposed between the first jet head and the third jet head, and the second jet head is configured to eject the spacing gas. The other set of jet heads includes a first jet head and a third jet head, wherein a gas-discharge region is disposed between the first jet head and the third jet head. The substrate 1 is controlled to sequentially pass through the first jet region, the gas-discharge region, the second jet region, and the third jet region, wherein the first precursor is introduced to the first jet region, the spacing gas is introduced to the second jet region, and the second precursor is introduced to the third jet region. As such, the spatial separation and multiple depositions can be realized.

Figure 9:
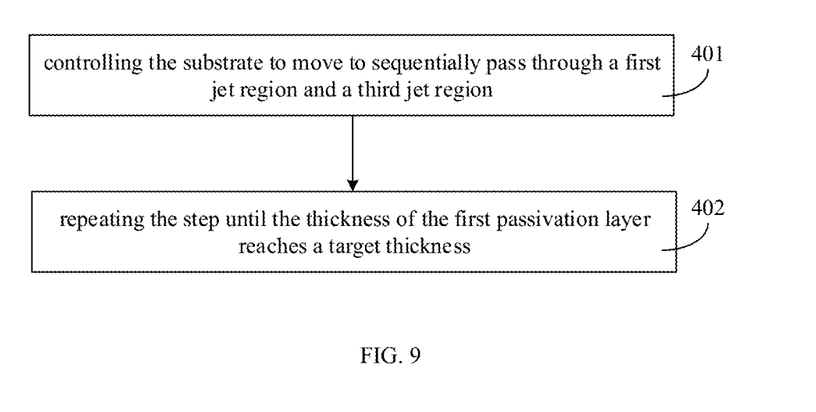
FIG. 9 is a flow chart of a process of forming a first passivation layer by using an ALD space method provided by another embodiment of the present application.

In another embodiments, referring to FIG. 9, the ALD space method includes following steps:

step 401, controlling the substrate 1 to move to sequentially pass through a first jet region and a third jet region, wherein the first precursor source is introduced to the first jet region, the second precursor source is introduced to the third jet region, and the first jet region is spaced from the third jet region by a first distance d; and step 402, repeating the step 401 until the thickness of the first passivation layer 21 reaches a target thickness.

Figure 10:
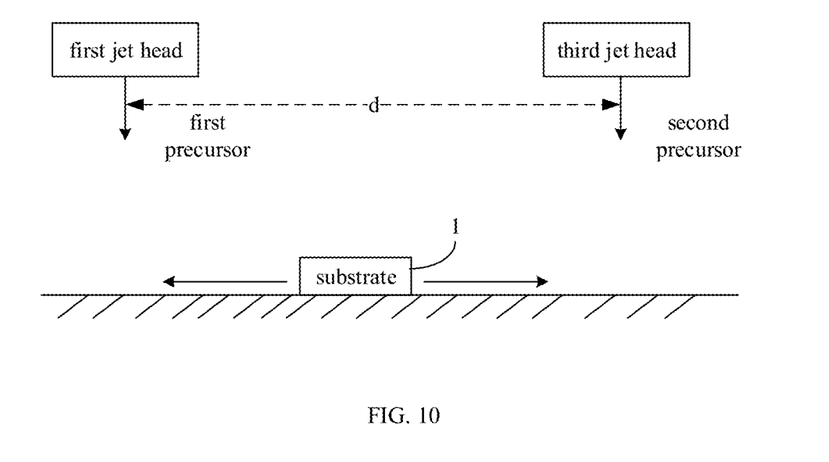
FIG. 10 is a schematic view of an arrangement of jet heads on the basis of FIG. 9, provided by another embodiment of the present application.

Referring to FIG. 10, the substrate 1 is placed on a heating plate. The heating plate is moved to drive the substrate 1 to move in the reaction chamber. The first precursor source and the second precursor source are respectively introduced from different jet heads, that is, the first jet head configured to eject the first precursor and the third jet head configured to eject the second precursor. By spacing the first jet region from the third jet region by the first distance d, the reaction between the first precursor source and the second precursor source in areas other than on the first surface of the substrate 1 can be effectively suppressed, thereby reducing the wraparound.

In some embodiments, the first distance d can be determined according to the flow rates and/or jet pressures of the first precursor source and the second precursor source.

Specifically, the first distance d is to satisfy the need of reducing the reaction between the first precursor source and the second precursor source in areas other than on the first surface of the substrate 1. Therefore, the greater the flow rate or the jet pressure of the first precursor source and the second precursor source, the easier the reaction of the two precursor sources under the action of gas flow. Therefore, the distance d is positively correlated with the flow rate and jet pressure of the first precursor source and/or second precursor source, and that is, the larger the flow rate or the jet pressure of the first precursor source and the second precursor source, the larger the distance d, so as to improve the spatial separation effect.

In these embodiments, since the first jet region and the third jet region are separated by the first distance d, no additional equipment or gas is needed, and a large proportion of the first precursor source and second precursor source can be ensured to react on the first surface of the substrate 1, thereby reducing the wraparound. In other words, there is no other jet region to which any other gaseous substance is introduced between the first jet region and the third jet region.

In some embodiments, the second passivation layer can be formed by using PECVD.

In these embodiments, the second passivation layer can be formed by using PECVD in order to improve the forming efficiency, without considering the wraparound of the second passivation layer.

In some other embodiments, the second passivation layer can be formed by alternately performing PECVD and the ALD space method.

In these embodiments, the wraparound of the second passivation layer can be reduced to a certain extent while the forming efficiency can be improved. In addition, the atomic packing density of the second passivation layer can be improved, thereby further improving the passivation effect.

In some embodiments, a hydrogen content in the first passivation layer 21 is less than that in the second passivation layer 22. The hydrogen content of the passivation layer 2 is related to the corresponding forming technique. Specifically, take the first passivation layer 21 and the second passivation layer 22 made of aluminum oxide as an example, the second passivation layer 22 can be formed by using PECVD, which results a relatively high hydrogen content in the second passivation layer 22. For example, by controlling the introduced amount of TMA and the saturation degree of the reaction, a relatively high hydrogen content in the second passivation layer 22 can be achieved. The first passivation layer 21 can be formed by using the ALD time method, which results a relatively low hydrogen content in the first passivation layer 21. For example, by controlling the introduced amount of TMA and the saturation degree of the reaction, a relatively low hydrogen content in the first passivation layer 21. The lower the hydrogen content in the passivation layer, the better the passivation effect. Thus, while ensuring a relatively high forming efficiency of the passivation layer 2, the passivation effect of the second passivation layer 22 can be further improved by alternately performing PECVD and the ALD space method to form the second passivation layer 22, so as to further improve the passivation effect of the passivation layer 2.

In some embodiments, a negative charge density in the first passivation layer 21 is greater than that in the second passivation layer 22. Specifically, the higher the negative charge density at the interface between the passivation layer 2 and the substrate 1 such as the silicon wafer, the stronger the ability to shield the minority carriers on the p-type silicon surface, and the better the field passivation effect.

In these embodiments, the negative charge density in the first passivation layer 21 is greater than that in the second passivation layer 22, so that the passivation effect of the first passivation layer 21 adjacent to the substrate 1 is better than that of the second passivation layer 22 away from the substrate 1, which can more effectively improve the photoelectric conversion efficiency of the solar cell.

It should be understood that although the steps in the flow charts involved in the above embodiments are shown sequentially as indicated by the arrows, these steps are not necessarily executed sequentially in the order indicated by the arrows. Unless otherwise specified herein, the sequence of the steps is not strictly limited, and the steps may be performed in other orders. Moreover, at least some of the steps in the flow charts involved in the above embodiments may include multiple sub-steps or multiple stages, and these sub-steps or stages are not necessarily performed at the same time, but may be performed at different times. These sub-steps or stages are not necessarily to be sequentially performed, but can be performed alternately or in turn with at least some of the sub-steps or stages of other steps.

In a second aspect, some embodiments of the present application provide a photovoltaic device, including multiple solar cells. The multiple solar cells are electrically connected in series and/or in parallel. At least one solar cell is the solar cell as described in the first aspect.

In some embodiments, the photovoltaic device also includes an encapsulation layer and a cover plate. The encapsulation layer is configured to cover the surface of the solar cells connected in series and/or in parallel. The cover plate is configured to cover the surface of the encapsulation layer away from the cell group. The solar cells are electrically connected in the form of a whole piece or multiple pieces.

In some embodiments, the multiple solar cells can be electrically connected through conducting strips. The encapsulation layer covers the surfaces of the solar cells and the conducting strips, to encapsulate the solar cells.

In some embodiments, the encapsulation layer can be an organic encapsulation film, such as an ethylene-vinyl acetate copolymer film, a polyethylene-octene elastomer film, or a polyethylene terephthalate film.

In another embodiments, the cover plate can be with a light-transmitting function, such as a glass cover plate or a plastic cover plate.

An embodiment of the present application also provides a photovoltaic system, including the photovoltaic device in the second aspect.

It can be understood that the photovoltaic system can be applied to photovoltaic power stations, such as ground power stations, roof power stations, water surface power stations, etc., and can also be applied to equipment or devices that use solar energy to generate electricity, such as user solar power supplies, solar street lights, solar cars, solar buildings, etc. It also can be understood that the application scenarios of the photovoltaic system are not limited to the above.

That is to say, the photovoltaic system can be applied in all fields that need to use solar energy for power generation. Taking a photovoltaic power generation network as an example, the photovoltaic system can include photovoltaic arrays, a combiner box, and an inverter. The photovoltaic array can be an array of photovoltaic devices. For example, multiple photovoltaic devices can form multiple photovoltaic arrays. The photovoltaic arrays are connected to the combiner box. The combiner box can combine the currents generated by the photovoltaic arrays. The combined current flows through the inverter and is converted into the alternating current suitable for the power grid, and then conducted to the power grid to realize solar power supply.

The technical features of the above embodiments can be combined arbitrarily. In order to make the description concise, not all possible combinations of the technical features are described in the embodiments. However, as long as there is no contradiction in the combination of these technical features, the combinations should be considered as in the scope of the present application.

The above-described embodiments are only several implementations of the present application, and the descriptions are relatively specific and detailed, but they should not be construed as limiting the scope of the present application. It should be understood by those of ordinary skill in the art that various modifications and improvements can be made without departing from the concept of the present application, and all fall within the protection scope of the present application. Therefore, the patent protection of the present application shall be defined by the appended claims.

What is claimed is:

1. A solar cell, comprising:
   a substrate including a first surface and a second surface opposite to each other in a thickness direction of the substrate;
   a first passivation layer disposed on the first surface of the substrate;
   a second passivation layer disposed on a side of the first passivation layer away from the substrate;
   wherein a first material of the first passivation layer is the same as a second material of the second passivation layer; a first atomic packing density of the first passivation layer is higher than a second atomic packing density of the second passivation layer; an average first thickness of the first passivation layer is smaller than an average second thickness of the second passivation layer; and a first hydrogen content of the first passivation layer is less than a second hydrogen content of the second passivation layer.

2. The solar cell according to claim 1, wherein the average first thickness is in a range from 0.1 nm to 6 nm, and the average second thickness is in a range from 1 nm to 30 nm.

3. The solar cell according to claim 1, wherein a first thickness uniformity of the first passivation layer is greater than a second thickness uniformity of the second passivation layer.

4. The solar cell according to claim 3, wherein a first thickness difference between different regions of the first passivation layer is smaller than 0.5 nm, and a second thickness difference between different regions of the second passivation layer is greater than 0.5 nm.

5. The solar cell according to claim 1, wherein the first passivation layer and the second passivation layer further cover a peripheral side of the substrate, a first covering area of the first passivation layer on the peripheral side of the substrate is less than or equal to a second covering area of the second passivation layer on the peripheral side of the substrate.

6. The solar cell according to claim 5, wherein the substrate includes a first thickness section and a second thickness section arranged in sequence in a direction away from the first passivation layer; the first passivation layer covers the peripheral side corresponding to the first thickness section, and the second passivation layer covers the peripheral side corresponding to the first thickness section and the second thickness section.

7. The solar cell according to claim 6, wherein a thickness of the first thickness section is greater than or equal to ½ of a thickness of the substrate 1, and smaller than or equal to a thickness of the substrate, a sum of the thickness of the first thickness section and a thickness of the second thickness section is greater than or equal to ⅔ of the thickness of the substrate, and smaller than or equal to the thickness of the substrate.

8. The solar cell according to claim 7, wherein the thickness of the first thickness section is in a range from 10 μm to 200 μm, and the sum of the thicknesses of the first thickness section and the second thickness section is in a range from 50 μm to 200 μm.

9. The solar cell according to claim 1, being an N-type tunnel oxide passivated contact cell.

10. The solar cell according to claim 1, wherein the substrate is an N-type silicon substrate.

11. The solar cell according to claim 1, wherein the material of the first passivation layer and the material of the second passivation layer are both aluminum oxide represented by $AlO_x$, where x is in a range from 1.45 to 1.55 in the first passivation layer, and is in a range from 0.5 to 2 in the second passivation layer.

12. The solar cell according to claim 11, wherein a proportion of trivalent aluminum ions of the aluminium oxide in the first passivation layer is greater than 85% by mole.

13. A photovoltaic device, comprising:
 a plurality of solar cells, the plurality of solar cells being connected in series and/or in parallel;
 wherein at least one of the solar cells is the solar cell according to claim 1.

14. A photovoltaic system, comprising the photovoltaic device according to claim 13.

15. The solar cell according to claim 1, wherein a first negative charge density of the first passivation layer is greater than a second negative charge density of the second passivation layer.

* * * * *